United States Patent
Liao et al.

(10) Patent No.: US 9,941,842 B2
(45) Date of Patent: Apr. 10, 2018

(54) AMPLIFIER BIAS CIRCUIT

(71) Applicant: QUALCOMM Incorporated, San Diego, CA (US)

(72) Inventors: Shu-Hsien Liao, San Jose, CA (US); Feipeng Wang, San Jose, CA (US); Cheng-Han Wang, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 29 days.

(21) Appl. No.: 14/598,612

(22) Filed: Jan. 16, 2015

(65) Prior Publication Data

US 2016/0211804 A1 Jul. 21, 2016

(51) Int. Cl.
| | | |
|---|---|---|
| *H03F 3/04* | (2006.01) |
| *H03F 1/02* | (2006.01) |
| *H03F 3/19* | (2006.01) |
| *H03F 3/21* | (2006.01) |
| *H03F 1/22* | (2006.01) |
| *H03F 1/32* | (2006.01) |
| *H03F 3/24* | (2006.01) |

(52) U.S. Cl.
CPC ......... *H03F 1/0205* (2013.01); *H03F 1/0266* (2013.01); *H03F 1/223* (2013.01); *H03F 1/3205* (2013.01); *H03F 3/19* (2013.01); *H03F 3/21* (2013.01); *H03F 3/245* (2013.01); *H03F 2200/18* (2013.01); *H03F 2200/294* (2013.01); *H03F 2200/451* (2013.01); *H03F 2200/555* (2013.01); *H03F 2201/3209* (2013.01)

(58) Field of Classification Search
CPC ...... H03F 1/0205; H03F 3/211; H03F 3/2171; H03F 3/45179; H03F 2203/21109; H03F 2203/45116
USPC ........ 330/11, 96, 123, 124 R, 129, 133, 136, 330/140, 149, 199, 253, 257, 261, 2, 67, 330/273, 281, 285, 296, 303; 375/297; 455/114.2, 114.3, 127.1, 571
See application file for complete search history.

(56) References Cited

U.S. PATENT DOCUMENTS 6,233,440 B1    5/2001  Taylor
6,972,628 B2 *  12/2005 Eo ..................... H03F 1/0266
                                                        330/133

(Continued)

FOREIGN PATENT DOCUMENTS

EP          2782245 A1      9/2014
WO     2005078917 A1      8/2005

OTHER PUBLICATIONS

Choi, et al., "A New Power Management IC Architecture for Envelope Tracking Power Amplifier," IEEE Transactions on Microwave Theory and Techniques, vol. 59, No. 7, Jul. 2011, pp. 1796-1802.

(Continued)

*Primary Examiner* — Steven J Mottola
*Assistant Examiner* — Hafizur Rahman
(74) *Attorney, Agent, or Firm* — Procopio, Cory, Hargreaves

(57) ABSTRACT

A power amplifier bias circuit having high dynamic range and low memory is disclosed. In an exemplary embodiment, an apparatus includes an output stage configured to generate a biased RF signal based on a first DC signal and a filtered signal. The apparatus also includes a low pass filter configured to filter the biased RF signal to generate the filtered signal.

11 Claims, 4 Drawing Sheets

(56) References Cited

U.S. PATENT DOCUMENTS

| | | | |
|---|---|---|---|
| 7,576,612 B2* | 8/2009 | Nakamura | H03F 1/30 330/296 |
| 7,577,211 B2 | 8/2009 | Braithwaite et al. | |
| 8,076,973 B2 | 12/2011 | Yang et al. | |
| 8,351,877 B2 | 1/2013 | Kim et al. | |
| 8,854,143 B2* | 10/2014 | Bouny | H03F 1/0205 330/285 |

OTHER PUBLICATIONS

International Search Report and Written Opinion—PCT/US2015/067924—ISA/EPO—dated Apr. 5, 2016.

* cited by examiner

AMPLIFIER BIAS CIRCUIT

BACKGROUND

I. Field

The present disclosure relates generally to amplifiers, and more specifically to bias circuits for power amplifiers.

II. Background

A wireless device (e.g., a cellular phone or a smartphone) in a wireless communication system may transmit and receive data for two-way communication. For example, the wireless device may operate in a frequency division duplexing (FDD) system or in a time division duplexing (TDD) system. The wireless device may include a transmitter for data transmission and a receiver for data reception. Thus, the wireless device may process both analog and digital signals in order to provide communication and/or data services.

A radio transmitter's power amplifier is typically required to be linear and accurately reproduce an amplified signal from an input signal. For example, an amplifier that has a non-linear input/output relationship may cause the output signal to splatter over to adjacent radio frequencies. To address this, predistortion may be used to generate an inverse of the amplifier's gain and phase characteristics to compensate for the amplifier's non-linear input/output relationship to produce a more linear system with reduced distortion. Predistortion can be implemented as an analog or digital process.

Power amplifiers also suffer from memory effects. Memory effects are non-noise circuit characteristics that cannot be described by the steady-state nonlinear transfer function of the circuit. Power amplifier memory effects may significantly distort transmit signal integrity, which may show up as error vector magnitude (EVM) degradation. One approach to minimize memory effects is to create low output impedance from a bias circuit that biases the amplifier. Diode based bias circuits are a common biasing scheme in power amplifiers. However, this common biasing scheme may result in limited dynamic range and trade-offs affecting RF performance. For example, it is desirable to make the bias circuit as fast as possible to allow digital correction to be successful. However, fast diode based bias circuits are large and may load the RF input signal such that a drop in gain may occur.

It is therefore desirable to have a bias circuit with high dynamic range to support a wider range of bias conditions and low memory for use with power amplifiers.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
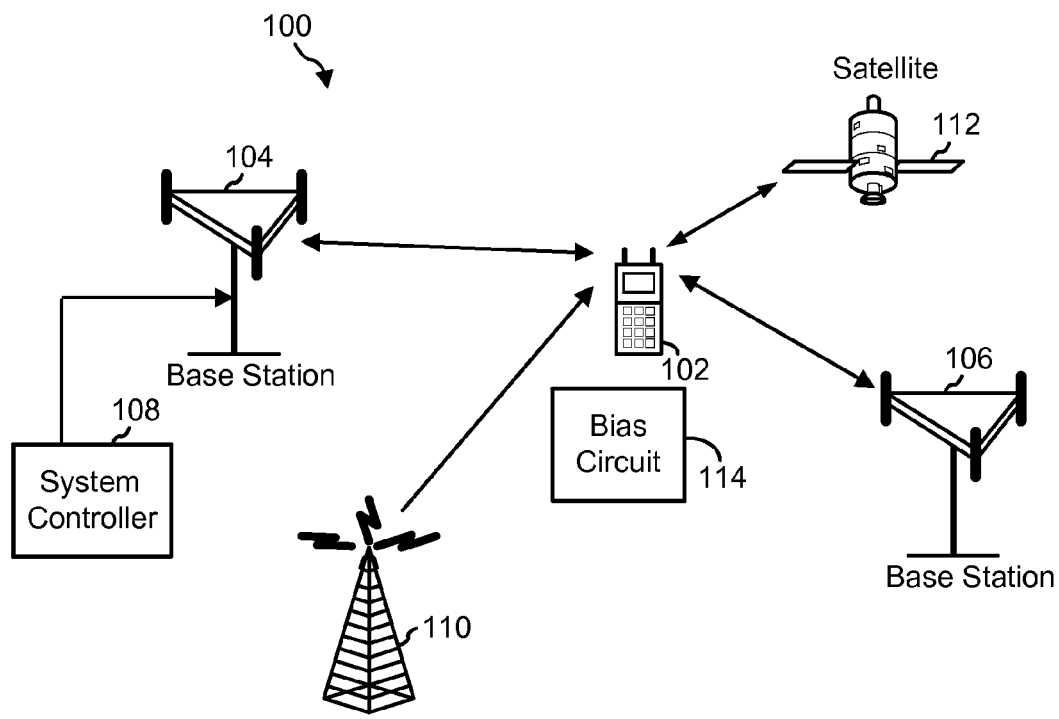
FIG. 1 shows an exemplary embodiment of a bias circuit that has high dynamic range and low memory to bias RF signals input to a power amplifier in a wireless device communicating within a wireless system.

FIG. 1 shows an exemplary embodiment of a bias circuit 114 that has high dynamic range and low memory to bias RF signals input to an RF power amplifier (PA) in a wireless device 102 communicating within a wireless system 100. Wireless system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless system 100 including two base stations 104 and 106 and one system controller 108. In general, wireless system 100 may include any number of base stations and any set of network entities.

Wireless device 102 may also be referred to as a user equipment (UE), a mobile station, a terminal, an access terminal, a subscriber unit, or a station. Wireless device 102 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, or other communicating device. Wireless device 102 may communicate with devices in the wireless system 100. Wireless device 102 may also receive signals from broadcast stations (e.g., a broadcast station 110), or signals from satellites (e.g., a satellite 112) in one or more global navigation satellite systems (GNSS). Wireless device 102 may support one or more radio technologies for wireless communication such as LTE, WCDMA, CDMA 1X, EVDO, TD-SCDMA, GSM, 802.11. In an exemplary embodiment, the wireless device 102 comprises the bias circuit 114 that generates bias signals for use with various circuitries in the wireless device 102. For example, the bias circuit 114 may be used to provide bias signals to bias a power amplifier that amplifies RF signals for transmission from the device wireless 102. In various exemplary embodiments, the bias circuit 114 has high dynamic range and low memory to provide improved performance over conventional bias circuits.

Figure 2:
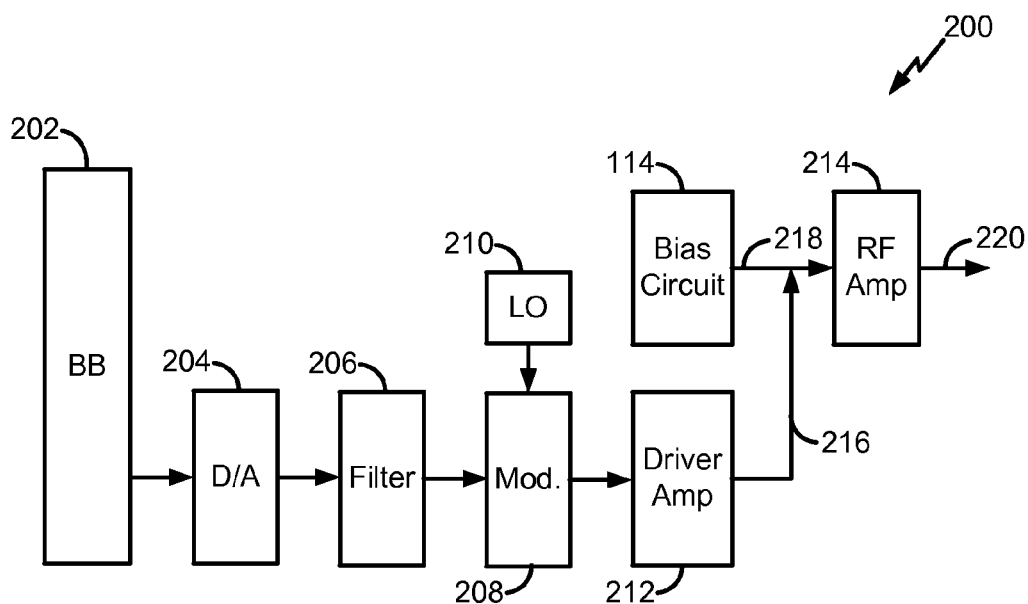
FIG. 2 shows a transmitter front end that includes an exemplary embodiment of the bias circuit shown in FIG. 1.

FIG. 2 shows a transmitter front end 200 for use in the device 102 that includes an exemplary embodiment of the bias circuit 114 shown in FIG. 1. The front end 200 includes a baseband (BB) processor 202 that processes baseband signals to be transmitted from the device 102. Digital baseband signals to be transmitted are output from the BB processor 202 and input to a digital to analog (D/A) converter that converts the digital signals to analog. The analog signal are filtered by the filter 206 and the filtered output is input to a modulator 208 that modulates the analog baseband signal using a local oscillator 210 to generate RF signals to be transmitted. The RF signals output from the modulator 208 are input to a driver amplifier 212 that outputs amplified RF signals 216 that are to be input to an RF amplifier 214. For example, the RF amplifier 214 is an RF power amplifier.

The RF input signal 216 is biased by a bias signal 218 output from the bias circuit 114. In an exemplary embodiment, the bias circuit 114 generates the bias signal 218 to provide high dynamic range and low memory, thereby resulting in improved performance over conventional bias circuits. The biased RF signal is input to the RF amplifier 214 that amplifies the biased RF signal to generate an amplified biased RF signal for transmission from the device 102.

Figure 3:
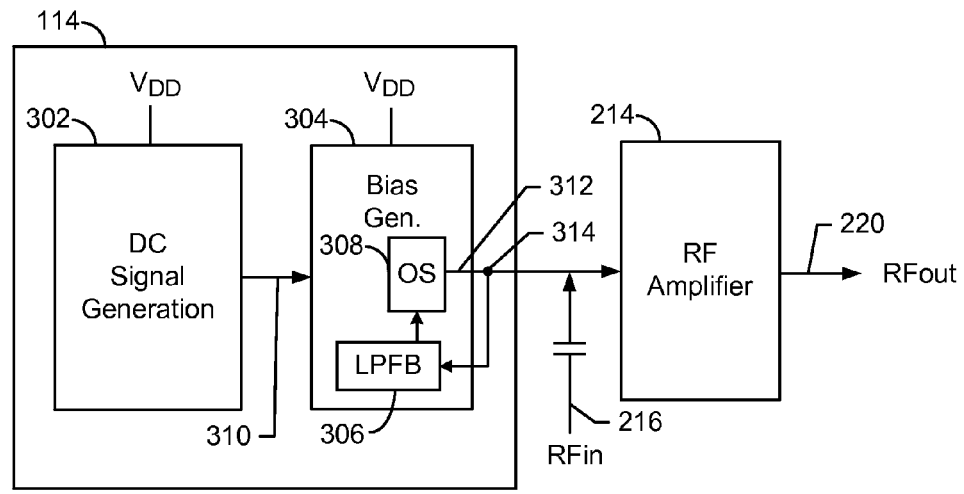
FIG. 3 shows a block diagram of an exemplary embodiment of the bias circuit shown in FIG. 1.

FIG. 3 shows a block diagram of an exemplary embodiment of the bias circuit 114 shown in FIG. 1 and FIG. 2. The bias circuit 114 includes a DC signal generator 302 and a bias generator 304. The bias generator 304 includes a low pass feedback (LPFB) circuit 306 and an output stage 308.

During operation, the DC signal generator 302 generates one or more DC signals 310 that are input to the bias generator 304. The output stage 308 of the bias generator 304 uses the received DC signals to generate a bias level (indicated at 312) that biases the RF signal 216 to generate a biased RF signal at node 314 that is input to the RF amplifier 214. The LPFB circuit 306 low pass filters the biased RF signal at node 314 and generates a filtered signal that is input to the output stage 308 to generate the bias level 312.

The RF amplifier 214 receives the biased RF signal at node 314 and generates the amplified biased RF signal 220. For example, the amplified biased RF signal 220 can be transmitted from an antenna to other devices in the communication system 100 shown in FIG. 1. Therefore, in various exemplary embodiments, the disclosed bias circuit 114 generates a bias signal having wide dynamic range and low memory to bias an RF signal prior to power amplification that results in maintaining or improving the effectiveness of digital predistortion applied to the RF signal.

Figure 4:
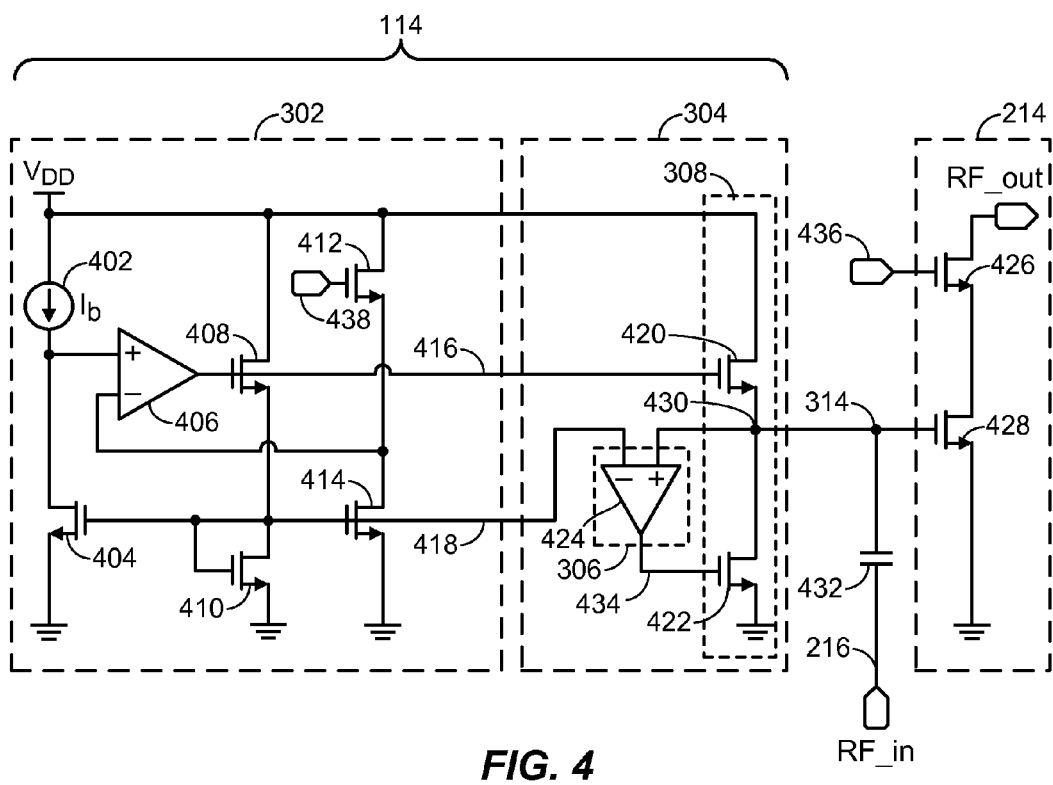
FIG. 4 shows a detailed exemplary embodiment of the bias circuit shown in FIG. 3.

FIG. 4 shows a detailed exemplary embodiment of the bias circuit 114 shown in FIG. 3. The DC signal generator 302 includes a current source 402 that has a first terminal connected to a supply voltage (VDD) and a second terminal connected to a drain terminal of transistor 404. A source terminal of the transistor 404 is connected to a signal ground. The second terminal of the current source 402 is also connected to a non-inverting input of amplifier 406. An output terminal of amplifier 406 is connected to a gate terminal of transistor 408 and also outputs a first DC signal 416. A drain terminal of transistor 408 is connected to the supply voltage (VDD) and a source terminal of the transistor 408 is connected to a drain terminal of transistor 410.

The transistor 410 has a gate terminal connected to its drain terminal and a source terminal connected to the signal ground. The drain terminal of the transistor 410 is also connected to a gate terminal of transistor 404 and a gate terminal of transistor 414. The transistor 414 has a source terminal connected to the signal ground and a second DC signal 418 is output from its gate terminal. In an exemplary embodiment, the signals 416 and 418 are DC values that are set to track temperature and compensate for process variations.

A transistor 412 has a drain terminal connected to the supply voltage (VDD) and a source terminal connected to an inverting input of the amplifier 406 and the drain terminal of the transistor 414. A gate terminal of the transistor 412 is connected to receive a DC value 438 that in an exemplary embodiment is determined during a calibration or initialization of the bias circuit 114. For example, the value 438 is set to compensate for variations within the bias circuit 114.

The output stage 308 of the bias generator 304 includes a transistor 420 that has a drain terminal connected to the supply voltage (VDD) and gate terminal that is connected to the gate terminal of transistor 408 to receive the first DC signal 416. The transistor 420 also has a source terminal connected to the output node 430. A transistor 422 has a source terminal connect to the signal ground and a drain terminal connected to the output node 430.

The LPFB circuit 306 includes an op-amp 424 that has a non-inverting terminal connected to the output node 430 and an inverting terminal connected to the gate terminal of transistor 414 to receive the second DC signal 418. An output terminal of the op-amp 424 is connected to a gate terminal of the transistor 422. The op-amp 424 outputs a low pass filtered signal 434 that is input to the gate terminal of the transistor 422. For example, in an exemplary embodiment, the op-amp is configured as a video amplifier that provides low pass filtering. The output stage 308 generates a bias level at the output node 430. For example, the output stage 308 generates the bias level at the output node 430 from the DC signal 416 that is input to the base of the transistor 420 and the low pass filtered signal 434 that is input to the base of transistor 422.

The RF amplifier 214 includes transistor 426 and transistor 428. The transistor 426 has a source terminal that is connected to a drain terminal of transistor 428. The transistor 426 has a drain terminal that outputs an amplified biased RF signal (RF_out) and a gate terminal that receives a control signal 436. In an exemplary embodiment the control signal 436 is a DC signal. For example, in one embodiment, the control signal 436 is the same as the DC value 438. The transistor 428 has a source terminal connected to a signal ground and a gate terminal connected to receive the biased RF signal at node 314 that is biased by the bias level at the node 430. The modulated RF input signal 216 flows through DC blocking capacitor 432 to the node 314 at the input of the amplifier 214.

During operation, the output stage 308 of the bias generator 304 generates the bias level at the output node 430. The output node 430 is also connected to the node 314 to bias the RF signal 216 after it passes through the DC blocking capacitor 432. Thus, the biased RF signal at node 314 also appears at the output node 430. Thus, the biased RF signal appears at both the nodes 430 and 314. The op-amp 424 of the LPFB 306 receives at its non-inverting input the biased RF signal appearing at the node 430 and receives the second DC signal 418 at its inverting input. The op-amp 424 is configured to low pass filter the signal at its non-inverting input and to output the low pass filtered signal 434 that is input to the gate of transistor 422. The LPFB circuit 306 provides low pass filtering that senses transient variation in envelope frequency of the RF signal 216 and uses this variation to adjust the bias level at the node 430 to enhance bias response at high power levels.

In an exemplary embodiment, the op-amp 424 is configured to provide low pass filtering with a corner frequency of the low pass filtering set to be in between the modulation frequency (envelope bandwidth) and carrier frequency of the biased RF signal appearing at the nodes 430 and 314. For example, the RF signal 216 may be generated to conform to an 802.11n protocol, e.g., Modulation and Coding Schemes (MCS) having a high throughput (HT) rate of 40 MHz. With such a modulated RF input signal, the op-amp 424 is configured to provide low pass filtering with a corner frequency of approximately 200 MHz. It should be noted that this is just an example and that the low pass corner frequency is set based on the protocol/configuration of the modulated RF signal such that the corner frequency is between the modulation frequency and the carrier frequency. Thus, a low pass filtered version of the biased RF input signal at node 430 is used by the bias generator 304 to generate the bias level that also appears at the node 430.

Figure 5:
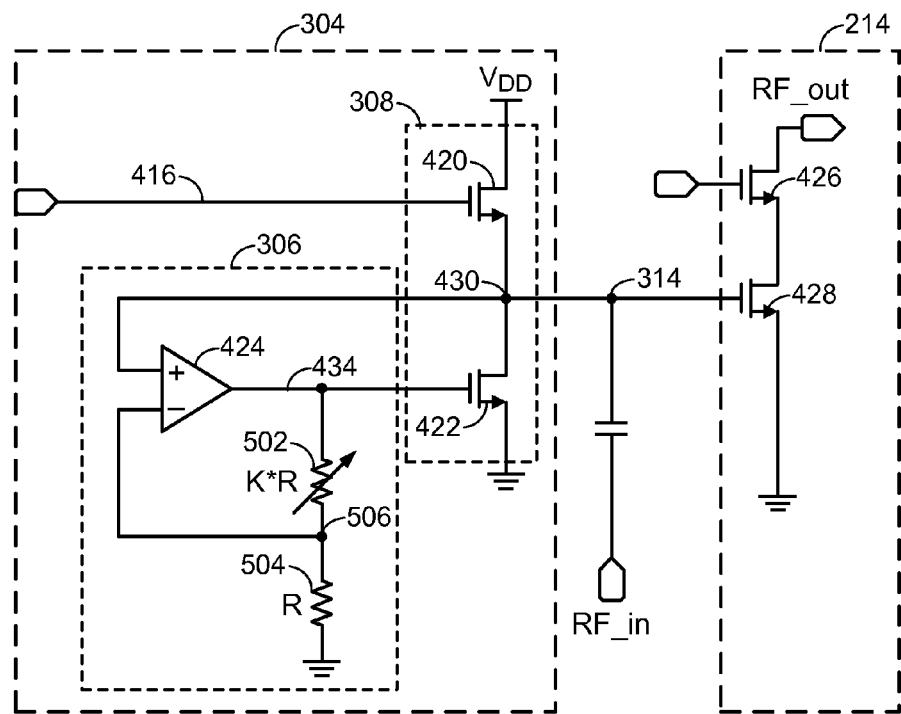
FIG. 5 shows a detailed alternative exemplary embodiment of the bias circuit shown in FIG. 3.

FIG. 5 shows a detailed alternative exemplary embodiment of the bias generator 304 shown in FIG. 4. The LPFB circuit 306 includes a gain circuit that comprises variable resistor 502 and resistor 504. The variable resistor 502 has a first terminal connected to the output terminal of the op-amp 424 and the gate terminal of the transistor 422. A second terminal of the resistor 502 is connected to the node 506 that is connected to the inverting input terminal of the op-amp 424 and to a first terminal of the resistor 504. A second terminal of the resistor 504 is connected to the signal ground. In an exemplary embodiment, the resistor 502 is a variable resistor that can be adjusted to provide a resistance value that is selected from a range of resistance values. For example, the resistor 502 can be adjusted to generate a resistor of (K*R) where K is any value and R is the value of the resistor 504. In an exemplary embodiment, another entity at the device (e.g., baseband processor) outputs a control signal to adjust the resistance of the variable resistor 502 to set the gain of the op-amp 424.

In an exemplary embodiment, the gain of the gain circuit is set according to the linearity requirements. For example, during conditions where there is greater non-linearity, the resistor 502 is set so that the op-amp 424 provides more gain. During conditions where there is less non-linearity, the resistor 502 is set to reduce the gain of the op-amp 424. In an exemplary embodiment, higher gain results in smaller variations on the filtered envelope output from the op-amp 424, which also results in lower memory effects.

Figure 6:
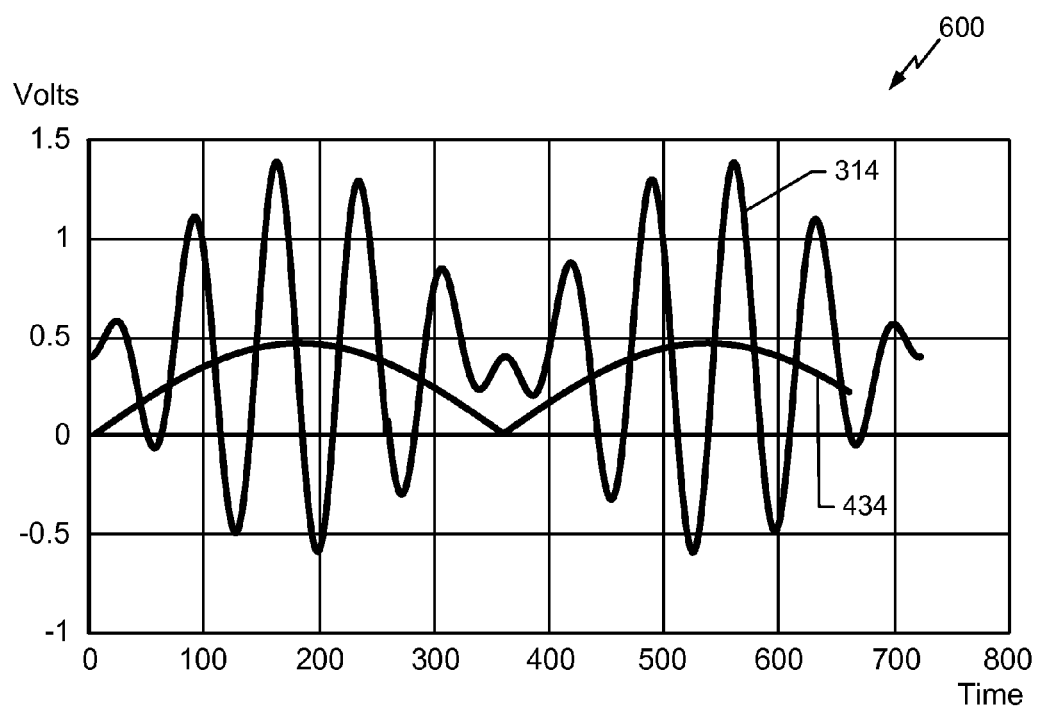
FIG. 6 shows a graph that illustrates the operation of the bias circuits shown in FIG. 4 and FIG. 5.

FIG. 6 shows a graph 600 that illustrates the operation of the bias circuit 114 shown in FIG. 3 and FIG. 4. The graph 600 shows the biased RF signal at node 314 that is input to a power amplifier 214. The graph 600 also shows the low pass filtered signal 434 at the output of the op-amp 424. As illustrated in the graph 600, the low pass filtered signal 434 slowly varies with the amplitude modulation of the RF input signal.

Figure 7:
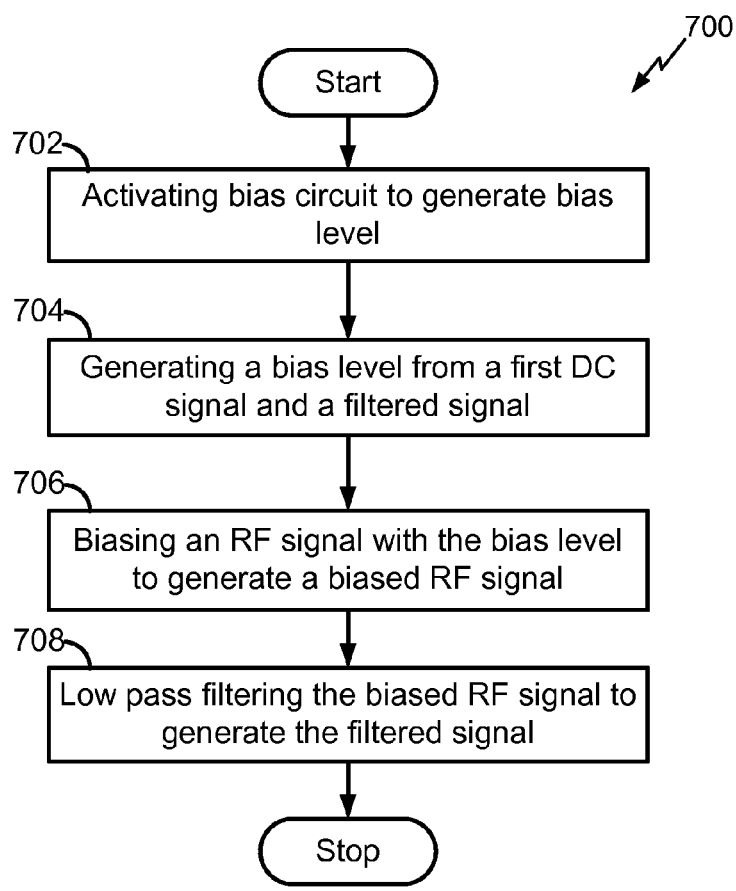
FIG. 7 shows an exemplary embodiment of a method for biasing an RF signal.

FIG. 7 shows an exemplary embodiment of a method 700 for biasing an RF signal. For example, in an exemplary embodiment, the method 700 is performed by the bias circuit 114.

At block 702, a bias circuit is activated to generate a bias level. For example, in an exemplary embodiment, the bias circuit 114 is activated by the baseband processor 202 to generate a bias level at the node 430.

At block 704, a bias level at the node 430 is generated from a first DC signal and a filtered signal. For example, in an exemplary embodiment, the output stage 308 generates a bias level at the node 430 in response to the DC signal 416 and the filtered signal 434.

At block 706, the bias level is used to bias an RF signal. In an exemplary embodiment, the bias level at node 430 biases an RF input signal 216. For example, the RF input signal is input to the node 314, which is also coupled to the node 430. Thus, the bias level and the RF input signal combine to form a biased RF signal that is input to the amplifier 214 and appears at both of the nodes 430 and 314.

At block 708, the filtered signal is generated by low pass filtering the biased RF signal. In an exemplary embodiment, the op-amp 424 low pass filters the biased RF signal at node 430 to generate the filtered signal 434 that is input to transistor 422, which uses the filtered signal to generate the bias level that appears at node 430.

Thus, the method 700 operates to generate a bias signal to bias an RF signal that is input to an RF amplifier. It should be noted that the operations of the method 700 are exemplary and may be rearranged or modified within the scope of the exemplary embodiments.

Figure 8:
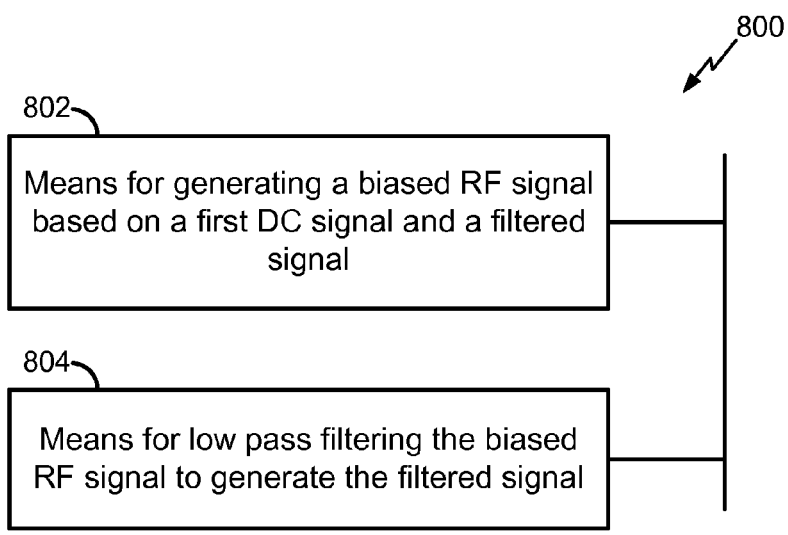
FIG. 8 shows an exemplary embodiment of a bias generator apparatus.

FIG. 8 shows an exemplary embodiment of a bias generator apparatus 800. In an exemplary embodiment, the apparatus 800 is suitable for use as the bias generator 304 shown in FIGS. 3 thru 5.

The apparatus 800 includes a first means (802) for generating a biased RF signal based on a first DC signal and a filtered signal, which in an exemplary embodiment comprises the output stage 308. The apparatus 800 also comprises a second means (804) for low pass filtering the biased RF signal to generate the filtered signal, which in an exemplary embodiment comprises the low pass feedback circuit 306.

The exemplary embodiments described herein may be implemented on an IC, an analog IC, an RFIC, a mixed-signal IC, an ASIC, a printed circuit board (PCB), an electronic device, etc. The exemplary embodiments may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing an exemplary embodiment described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but the disclose is to be accorded the widest scope consistent with the principles and novel features disclosed herein.

What is claimed is:
1. An apparatus comprising:
   an output stage configured to generate a biased RF signal based on a first DC signal and a filtered signal;
   a low pass filter configured to filter the biased RF signal to generate the filtered signal, the low pass filter comprising an op-amp that receives a third signal at an inverting input terminal and the biased RF signal at a non-inverting input terminal, and outputs the filtered signal from an output terminal; and a gain circuit configured to generate the third signal, the gain circuit comprising a first resistor having a first terminal connected to the output terminal of the op-amp and a second terminal connected to the inverting input terminal of the op-amp, and a second resistor having a first terminal connected to the inverting input terminal of the op-amp and a second terminal connected to a signal ground.

2. An apparatus comprising:
an output stage configured to generate a biased RF signal based on a first DC signal and a filtered signal, the output stage comprising first and second transistors, a source of the first transistor is connected to a node and a drain of the second transistor is connected to the node, the first and second transistors configured to generate a bias level at the node to generate the biased RF signal at the node; and
a low pass filter configured to filter the biased RF signal to generate the filtered signal,
the low pass filter comprising an op-amp that receives the biased RF signal at a non-inverting input terminal, and outputs the filtered signal from an output terminal.

3. The apparatus of claim 1, wherein the op-amp is configured to perform low pass filtering of the biased RF signal with a corner frequency set between a modulation frequency and a carrier frequency of the biased RF signal.

4. The apparatus of claim 2, the output terminal of the op-amp connected to a gate terminal of the second transistor.

5. The apparatus of claim 1, the first resistor comprising a variable resistor.

6. The apparatus of claim 5, the variable resistor having a selectable resistance value that sets a gain of the op-amp.

7. The apparatus of claim 1, the biased RF signal input to an RF power amplifier.

8. An apparatus comprising:
means for generating a biased RF signal based on a first DC signal and a filtered signal;
means for low pass filtering the biased RF signal to generate the filtered signal, the means for low pass filtering comprising an op-amp that receives a third signal at an inverting input terminal and the biased RF signal at a non-inverting input terminal and outputs the filtered signal from an output terminal; and
a gain circuit that generates the third signal, the gain circuit comprising a first resistor having a first terminal connected to the output terminal of the op-amp and a second terminal connected to the inverting input terminal of the op-amp, and a second resistor having a first terminal connected to the inverting input terminal of the op-amp and a second terminal connected to a signal ground.

9. The apparatus of claim 8, wherein the op-amp is configured to perform low pass filtering with a corner frequency set between a modulation frequency and a carrier frequency of the biased RF signal.

10. The apparatus of claim 8, the first resistor comprises a variable resistor having a selectable resistance value that sets a gain of the op-amp.

11. A method comprising:
generating a biased RF signal based on a DC signal and a filtered signal; and
filtering the biased RF signal to generate the filtered signal,
wherein the filtering comprises receiving a third signal at an inverting input terminal and the biased RF signal at a non-inverting input terminal of an op amp, and outputting the filtered signal from an output terminal of the op amp,
the filtering comprising low pass filtering the biased RF signal with a corner frequency set between a modulation frequency and a carrier frequency of the biased RF signal.

\* \* \* \* \*